United States Patent
Trezza

(10) Patent No.: US 7,687,400 B2
(45) Date of Patent: Mar. 30, 2010

(54) SIDE STACKING APPARATUS AND METHOD

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 0 days.

(21) Appl. No.: 11/688,088

(22) Filed: Mar. 19, 2007

(65) Prior Publication Data

US 2007/0278641 A1 Dec. 6, 2007

Related U.S. Application Data

(63) Continuation-in-part of application No. 11/329,481, filed on Jan. 10, 2006, and a continuation-in-part of application No. 11/329,506, filed on Jan. 10, 2006, and a continuation-in-part of application No. 11/329,539, filed on Jan. 10, 2006, and a continuation-in-part of application No. 11/329,540, filed on Jan. 10, 2006, and a continuation-in-part of application No. 11/329,556, filed on Jan. 10, 2006, and a continuation-in-part of application No. 11/329,557, filed on Jan. 10, 2006, and a continuation-in-part of application No. 11/329,558, filed on Jan. 10, 2006, now Pat. No. 7,560,813, and a continuation-in-part of application No. 11/329,574, filed on Jan. 10, 2006, now Pat. No. 7,534,722, and a continuation-in-part of application No. 11/329,575, filed on Jan. 10, 2006, and a continuation-in-part of application No. 11/329,576, filed on Jan. 10, 2006, and a continuation-in-part of application No. 11/329,873, filed on Jan. 10, 2006, now Pat. No. 7,538,033, and a continuation-in-part of application No. 11/329,874, filed on Jan. 10, 2006, and a continuation-in-part of application No. 11/329,875, filed on Jan. 10, 2006, and a continuation-in-part of application No. 11/329,883, filed on Jan. 10, 2006, and a continuation-in-part of application No. 11/329,885, filed on Jan. 10, 2006, and a continuation-in-part of application No. 11/329,886, filed on Jan. 10, 2006, now Pat. No. 7,521,806, and a continuation-in-part of application No. 11/329,887, filed on Jan. 10, 2006, now Pat. No. 7,215,032, and a continuation-in-part of application No. 11/329,952, filed on Jan. 10, 2006, and a continuation-in-part of application No. 11/329,953, filed on Jan. 10, 2006, now Pat. No. 7,157,372, and a continuation-in-part of application No. 11/329,955, filed on Jan. 10, 2006, and a continuation-in-part of application No. 11/330,011, filed on Jan. 10, 2006, and a continuation-in-part of application No. 11/422,551, filed on Jun. 6, 2006.

(60) Provisional application No. 60/690,759, filed on Jun. 14, 2005.

(51) Int. Cl.
*H01L 23/48* (2006.01)

(52) U.S. Cl. .............. 438/690; 438/685; 438/686

(58) Field of Classification Search ........... 257/690, 257/686
See application file for complete search history.

(56) References Cited

U.S. PATENT DOCUMENTS 3,312,878 A 4/1967 Poch et al.

(Continued)

FOREIGN PATENT DOCUMENTS

EP 0 516 866 12/1992

(Continued)

OTHER PUBLICATIONS

International Search Report for PCT/US06/23364, dated Nov. 13, 2006.

(Continued)

*Primary Examiner*—Long Pham

(57) ABSTRACT

A module has at least two ICs connected to each other such that they lie in different planes and are arranged as a first stack of ICs, a third IC is connected to at least one of the at least two ICs, wherein the third IC is off plane from both of the at least two ICs.

32 Claims, 7 Drawing Sheets

U.S. PATENT DOCUMENTS

| | | |
|---|---|---|
| 3,591,839 A | 7/1971 | Evans |
| 3,720,309 A | 3/1973 | Weir |
| 4,200,272 A | 4/1980 | Godding |
| 4,452,557 A | 6/1984 | Bouwknegt et al. |
| 4,873,205 A | 10/1989 | Critchlow et al. |
| 4,878,611 A | 11/1989 | LoVasco et al. |
| 4,893,174 A | 1/1990 | Yamada et al. |
| 4,915,494 A | 4/1990 | Shipley et al. |
| 4,967,248 A | 10/1990 | Shimizu |
| 4,999,077 A | 3/1991 | Drake et al. |
| 5,089,055 A | 2/1992 | Nakamura |
| 5,089,880 A | 2/1992 | Meyer et al. |
| 5,100,480 A | 3/1992 | Hayafuju |
| 5,120,597 A | 6/1992 | Takimoto et al. |
| 5,179,043 A | 1/1993 | Weichold et al. |
| 5,220,530 A | 6/1993 | Itoh |
| 5,229,315 A | 7/1993 | Jun et al. |
| 5,236,854 A | 8/1993 | Higaki |
| 5,308,784 A | 5/1994 | Kim et al. |
| 5,399,898 A | 3/1995 | Rostoker |
| 5,427,834 A | 6/1995 | Sodetz |
| 5,468,655 A | 11/1995 | Greer |
| 5,470,787 A | 11/1995 | Greer |
| 5,510,655 A | 4/1996 | Tanielian |
| 5,523,628 A | 6/1996 | Williams et al. |
| 5,561,594 A | 10/1996 | Wakefield |
| 5,563,084 A | 10/1996 | Ramm et al. |
| 5,587,119 A | 12/1996 | White |
| 5,589,029 A | 12/1996 | Matsui et al. |
| 5,598,965 A | 2/1997 | Scheu |
| 5,608,264 A | 3/1997 | Gaul |
| 5,635,014 A | 6/1997 | Taylor |
| 5,708,569 A | 1/1998 | Howard et al. |
| 5,780,776 A | 7/1998 | Noda |
| 5,814,889 A | 9/1998 | Gaul |
| 5,846,464 A | 12/1998 | Hoffman |
| 5,872,338 A | 2/1999 | Lan et al. |
| 5,929,524 A | 7/1999 | Drynan et al. |
| 5,962,922 A | 10/1999 | Wang |
| 5,963,793 A | 10/1999 | Rinne et al. |
| 5,973,396 A | 10/1999 | Farnworth |
| 6,030,894 A | 2/2000 | Hada et al. |
| 6,037,665 A | 3/2000 | Miyazaki |
| 6,075,710 A | 6/2000 | Lau |
| 6,087,719 A | 7/2000 | Tsunashima |
| 6,118,181 A | 9/2000 | Merchant et al. |
| 6,135,635 A | 10/2000 | Miller et al. |
| 6,184,066 B1 | 2/2001 | Chino et al. |
| 6,188,118 B1 | 2/2001 | Severn |
| 6,207,475 B1 | 3/2001 | Lin et al. |
| 6,215,114 B1 | 4/2001 | Yagi et al. |
| 6,232,668 B1 | 5/2001 | Hikita et al. |
| 6,277,711 B1 | 8/2001 | Wu |
| 6,283,693 B1 | 9/2001 | Acello et al. |
| 6,297,072 B1 | 10/2001 | Tilmans et al. |
| 6,314,013 B1 | 11/2001 | Ahn et al. |
| 6,316,737 B1 | 11/2001 | Evans et al. |
| 6,316,786 B1 | 11/2001 | Mueller et al. |
| 6,326,115 B1 | 12/2001 | Nakanishi et al. |
| 6,335,571 B1 | 1/2002 | Capote et al. |
| 6,393,638 B1 | 5/2002 | MacColl |
| 6,395,633 B1 | 5/2002 | Cheng et al. |
| 6,429,045 B1 | 8/2002 | Furukawa et al. |
| 6,451,626 B1 | 9/2002 | Lin |
| 6,484,776 B1 | 11/2002 | Meilunas et al. |
| 6,498,089 B2 | 12/2002 | Komada |
| 6,501,185 B1 | 12/2002 | Chow et al. |
| 6,509,256 B2 | 1/2003 | Medlen et al. |
| 6,513,236 B2 | 2/2003 | Tsukamoto |
| 6,531,022 B1 | 3/2003 | Tsukahara |
| 6,544,371 B2 | 4/2003 | Senoo et al. |
| 6,551,858 B2 | 4/2003 | Kawata et al. |
| 6,555,418 B2 | 4/2003 | Kurosawa et al. |
| 6,557,192 B2 | 5/2003 | Zheng |
| 6,559,540 B2 | 5/2003 | Kawashima |
| 6,576,830 B2 | 6/2003 | Nagao |
| 6,577,013 B1 | 6/2003 | Glenn et al. |
| 6,586,090 B2 | 7/2003 | Nakagawa et al. |
| 6,590,278 B1 | 7/2003 | Behun et al. |
| 6,596,640 B1 | 7/2003 | Fishcer et al. |
| 6,599,778 B2 | 7/2003 | Pogge et al. |
| 6,617,507 B2 | 9/2003 | Mapes et al. |
| 6,617,688 B2 | 9/2003 | Ikegami et al. |
| 6,627,477 B1 | 9/2003 | Hakey et al. |
| 6,635,960 B2 | 10/2003 | Farrar et al. |
| 6,635,970 B2 | 10/2003 | Lasky et al. |
| 6,674,647 B2 | 1/2004 | Pierson et al. |
| 6,680,540 B2 | 1/2004 | Nakano |
| 6,686,654 B2 | 2/2004 | Farrar et al. |
| 6,689,949 B2 | 2/2004 | Ortabasi |
| 6,703,555 B2 | 3/2004 | Takabayashi et al. |
| 6,704,953 B2 | 3/2004 | Fishman |
| 6,706,554 B2 | 3/2004 | Ogura |
| 6,717,045 B2 | 4/2004 | Chen |
| 6,727,582 B2 | 4/2004 | Shibata |
| 6,730,840 B2 | 5/2004 | Sasaoka et al. |
| 6,733,685 B2 | 5/2004 | Beilin et al. |
| 6,740,576 B1 | 5/2004 | Lin et al. |
| 6,756,594 B2 | 6/2004 | George et al. |
| 6,765,287 B1 | 7/2004 | Lin |
| 6,768,210 B2 | 7/2004 | Zuniga-Ortiz et al. |
| 6,770,555 B2 | 8/2004 | Yamazaki |
| 6,770,822 B2 | 8/2004 | Pasternak et al. |
| 6,780,280 B2 | 8/2004 | Halterbeck et al. |
| 6,798,030 B1 | 9/2004 | Izumi et al. |
| 6,824,643 B2 | 11/2004 | Yoshimoto et al. |
| 6,838,362 B2 | 1/2005 | Mastromatteo et al. |
| 6,841,883 B1 | 1/2005 | Farnworth et al. |
| 6,844,259 B2 | 1/2005 | Cheong |
| 6,846,725 B2 | 1/2005 | Nagarajan et al. |
| 6,869,856 B2 | 3/2005 | Combi et al. |
| 6,872,635 B2 | 3/2005 | Hayashi et al. |
| 6,881,609 B2 | 4/2005 | Salmon |
| 6,889,427 B2 | 5/2005 | Yee et al. |
| 6,903,443 B2 | 6/2005 | Farnworth et al. |
| 6,919,642 B2 | 7/2005 | Hsieh et al. |
| 6,929,974 B2 | 8/2005 | Ding et al. |
| 6,938,783 B2 | 9/2005 | Chung |
| 6,939,789 B2 | 9/2005 | Huang et al. |
| 6,967,307 B2 | 11/2005 | Hembree et al. |
| 6,986,377 B2 | 1/2006 | Johnson et al. |
| 6,992,824 B1 | 1/2006 | Motamedi et al. |
| 6,995,469 B2 | 2/2006 | Hatakeyama |
| 7,013,509 B2 | 3/2006 | Hickman |
| 7,015,590 B2 | 3/2006 | Jeong et al. |
| 7,023,347 B2 | 4/2006 | Arneson et al. |
| 7,033,859 B2 | 4/2006 | Pendse |
| 7,053,456 B2 | 5/2006 | Matsuo |
| 7,056,813 B2 | 6/2006 | Morrow et al. |
| 7,061,104 B2 | 6/2006 | Kenny et al. |
| 7,107,666 B2 | 9/2006 | Hiatt et al. |
| 7,115,505 B2 | 10/2006 | Hartwell |
| 7,135,777 B2 | 11/2006 | Bakir et al. |
| 7,141,869 B2 | 11/2006 | Kim et al. |
| 7,144,759 B1 | 12/2006 | Hilton et al. |
| 7,145,236 B2 | 12/2006 | Miura et al. |
| 7,157,310 B2 | 1/2007 | Benson et al. |
| 7,157,372 B1 | 1/2007 | Trezza |
| 7,170,183 B1 | 1/2007 | Kim et al. |
| 7,227,213 B2 | 6/2007 | Mastromatteo et al. |
| 7,233,028 B2 | 6/2007 | Weeks et al. |
| 7,242,099 B2 | 7/2007 | Lin et al. |
| 7,249,992 B2 | 7/2007 | Kalenian et al. |
| 7,253,519 B2 | 8/2007 | Huang et al. |

| | | | |
|---|---|---|---|
| 7,262,082 B1 | 8/2007 | Lin et al. | |
| 7,264,984 B2 | 9/2007 | Garabedian et al. | |
| 7,271,491 B1 | 9/2007 | Akram | |
| 7,294,531 B2 | 11/2007 | Hwang et al. | |
| 7,300,865 B2 | 11/2007 | Hsieh et al. | |
| 7,303,976 B2 | 12/2007 | Sand | |
| 7,326,629 B2 | 2/2008 | Nagarajan et al. | |
| 7,384,863 B2 | 6/2008 | Shibata | |
| 7,390,735 B2 | 6/2008 | Mehrotra | |
| 7,456,497 B2 | 11/2008 | Higashi | |
| 7,479,659 B2 | 1/2009 | Cognetti et al. | |
| 7,488,680 B2 | 2/2009 | Andry et al. | |
| 7,534,722 B2 | 5/2009 | Trezza | |
| 2001/0001292 A1 | 5/2001 | Bertin et al. | |
| 2001/0018230 A1 | 8/2001 | Jimarez et al. | |
| 2001/0033509 A1 | 10/2001 | Ahn et al. | |
| 2001/0048166 A1 | 12/2001 | Miyazaki | |
| 2002/0004299 A1 | 1/2002 | Schuele et al. | |
| 2002/0017399 A1 | 2/2002 | Chang et al. | |
| 2002/0027441 A1 | 3/2002 | Akram et al. | |
| 2002/0053726 A1 | 5/2002 | Mikubo et al. | |
| 2002/0094675 A1 | 7/2002 | Kerr et al. | |
| 2002/0102835 A1 | 8/2002 | Stucchi et al. | |
| 2002/0104873 A1 | 8/2002 | Lee et al. | |
| 2002/0127761 A1 | 9/2002 | Mottura et al. | |
| 2002/0134581 A1 | 9/2002 | Figueroa et al. | |
| 2003/0047799 A1 | 3/2003 | Cheever et al. | |
| 2003/0049425 A1 | 3/2003 | Ono et al. | |
| 2003/0052324 A1 | 3/2003 | Kimura | |
| 2003/0080408 A1 | 5/2003 | Farnworth et al. | |
| 2003/0085471 A1 | 5/2003 | Iijima et al. | |
| 2003/0145939 A1 | 8/2003 | Ahn et al. | |
| 2003/0159262 A1 | 8/2003 | Pasternak et al. | |
| 2003/0206680 A1 | 11/2003 | Bakir et al. | |
| 2003/0214036 A1 | 11/2003 | Sarihan et al. | |
| 2003/0216030 A1 | 11/2003 | Kim et al. | |
| 2003/0222354 A1 | 12/2003 | Mastromatteo et al. | |
| 2004/0029304 A1 | 2/2004 | Naydenkov et al. | |
| 2004/0031517 A1 | 2/2004 | Bareis | |
| 2004/0051168 A1 | 3/2004 | Arai et al. | |
| 2004/0104791 A1 | 6/2004 | Satoh et al. | |
| 2004/0124523 A1 | 7/2004 | Poo et al. | |
| 2004/0126927 A1 | 7/2004 | Lin et al. | |
| 2004/0177774 A1 | 9/2004 | Naitoh et al. | |
| 2004/0192029 A1 | 9/2004 | Hartwell | |
| 2004/0199998 A1 | 10/2004 | Shinner | |
| 2004/0207061 A1 | 10/2004 | Farrar et al. | |
| 2004/0238115 A1 | 12/2004 | Matsuno et al. | |
| 2004/0256686 A1 | 12/2004 | Sassolini et al. | |
| 2004/0262635 A1 | 12/2004 | Lee | |
| 2005/0042838 A1 | 2/2005 | Garyainov et al. | |
| 2005/0046034 A1 | 3/2005 | Farrar | |
| 2005/0048766 A1 | 3/2005 | Wu et al. | |
| 2005/0104027 A1 | 5/2005 | Lazarev | |
| 2005/0104219 A1 | 5/2005 | Matsui | |
| 2005/0121768 A1 | 6/2005 | Edelstein et al. | |
| 2005/0146049 A1 | 7/2005 | Kripesh et al. | |
| 2005/0163982 A1 | 7/2005 | Ono et al. | |
| 2005/0167830 A1 | 8/2005 | Chang et al. | |
| 2005/0184377 A1 | 8/2005 | Takeuchi et al. | |
| 2005/0230804 A1 | 10/2005 | Tanida et al. | |
| 2005/0233504 A1 | 10/2005 | Doi et al. | |
| 2005/0245059 A1 | 11/2005 | Yuan et al. | |
| 2005/0262634 A1 | 12/2005 | Gottlieb | |
| 2005/0263869 A1 | 12/2005 | Tanaka et al. | |
| 2005/0266670 A1 | 12/2005 | Lin et al. | |
| 2006/0001174 A1 | 1/2006 | Matsui | |
| 2006/0070704 A1 | 4/2006 | Sinclair et al. | |
| 2006/0073701 A1 | 4/2006 | Koizumi et al. | |
| 2006/0125084 A1 | 6/2006 | Fazzio et al. | |
| 2006/0128061 A1 | 6/2006 | Ravi et al. | |
| 2006/0170089 A1 | 8/2006 | Mizukoshi | |
| 2006/0208326 A1 | 9/2006 | Nasiri et al. | |
| 2006/0223301 A1 | 10/2006 | Vanhaelemeersch | |
| 2006/0228825 A1 | 10/2006 | Hembree | |
| 2006/0252262 A1 | 11/2006 | Kazemi | |
| 2006/0264029 A1 | 11/2006 | Heck et al. | |
| 2006/0275946 A1 | 12/2006 | MacNamara et al. | |
| 2006/0278988 A1 | 12/2006 | Trezza | |
| 2006/0278992 A1 | 12/2006 | Trezza et al. | |
| 2006/0281303 A1 | 12/2006 | Trezza et al. | |
| 2006/0281363 A1 | 12/2006 | Trezza | |
| 2006/0289990 A1 | 12/2006 | Farrar | |
| 2006/0292824 A1 | 12/2006 | Beyne et al. | |
| 2007/0020926 A1 | 1/2007 | Kalvesten et al. | |
| 2007/0096263 A1 | 5/2007 | Furukawa et al. | |
| 2007/0184653 A1 | 8/2007 | Blanchard | |
| 2007/0228576 A1 | 10/2007 | Trezza | |
| 2007/0249093 A1 | 10/2007 | Aiba et al. | |
| 2007/0278641 A1 | 12/2007 | Trezza | |
| 2008/0003817 A1 | 1/2008 | Morimoto | |
| 2008/0029851 A1 | 2/2008 | Kirby et al. | |
| 2008/0111582 A1 | 5/2008 | Matsui et al. | |
| 2008/0116567 A1 | 5/2008 | Amin et al. | |
| 2008/0213941 A1 | 9/2008 | Pendse | |
| 2008/0254618 A1 | 10/2008 | Umemoto et al. | |
| 2008/0284037 A1 | 11/2008 | Andry et al. | |

FOREIGN PATENT DOCUMENTS

| | | |
|---|---|---|
| EP | 0620701 | 10/1994 |
| EP | 0 757 386 A2 | 2/1997 |
| EP | 1 415 950 | 5/2004 |
| EP | 1 643 819 | 4/2006 |
| JP | 2001-129800 | 5/2001 |
| JP | 2004-214423 | 7/2004 |
| JP | 2004-273596 | 9/2004 |
| WO | WO 2004/084300 | 9/2004 |

OTHER PUBLICATIONS

Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.
International Search Report, PCT/US06/23361, dated Sep. 19, 2007.
The International Search Report and Written Opinion for PCT/US2006/23365 mailed on Jan. 19, 2007.
The International Search Report and Written Opinion for PCT/US2006/23362 mailed on May 20, 2008.
The International Search Report and Written Opinion for PCT/US2006/023250 mailed on May 19, 2008.
The International Search Report and Written Opinion for PCT/US2008/053994 mailed on May 26, 2008.
The International Search Report and Written Opinion for PCT/US2007/089061 mailed on Jun. 26, 2008.
The International Search Report and Written Opinion for PCT/US2006/023367 mailed on Jun. 10, 2008.
The Written Opinion for PCT/US2006/023297 mailed on Jan. 3, 2007.
The Written Opinion for PCT/US2006/023249 mailed on Jun. 19, 2007.
The Written Opinion for PCT/US2006/023364 mailed on Dec. 28, 2006.
The Written Opinion for PCT/US2006/023366 mailed on Dec. 8, 2006.
The Written Opinion for PCT/US2006/023361 mailed on Sep. 19, 2007.
"Fiber Optic Tutorial—Termination"—Website http://www.lanshack.com/fiber-optic-tutorial-termination.asp Aug. 1, 2003 available for www.archive.org, 7 pages
International Search Report for PCT/US06/23366, dated Dec. 8, 2006.
International Search Report, PCT/US06/23297, dated Jan. 3, 2007.
International Search Report, PCT/US06/23249, dated Jun. 11, 2007.

The International Search Report and Written Opinion for PCT/US2006/023246 mailed on Jul. 3, 2008.
The International Search Report and Written Opinion for PCT/US2006/023248 mailed on Jul. 3, 2008.
The International Search Report and Written Opinion for PCT/US2006/023363 mailed on Jul. 2, 2008.
The International Search Report and Written Opinion for PCT/US2006/023368 mailed on Jul. 11, 2008.
Harper, Charles A.; "Electronic Packaging and Interconnection Handbook"; 2000; McGraw-Hill, Third Edition; p. 6.1.
International Search Report and Written Opinion for PCT/IB2008/001429 mailed Apr. 3, 2009.
Merriam-Webster Online website, <http://www.merriam-webster.com/dictionary/bounding>.
International Preliminary Report on Patentability for PCT/US2006/023368 issued Mar. 31, 2009.
International Preliminary Report on Patentability for PCT/US2006/023363 issued Mar. 31, 2009.
International Preliminary Report on Patentability for PCT/US2006/23367 issued Mar. 31, 2009.
International Preliminary Report on Patentability for PCT/US2006/023246 issued May 5, 2009.
Merriam-Webster Online website, <http://www.meriam-webster.com/dictionary/bounding> printed on Apr. 10, 2009.
International Preliminary Report on Patentability for PCT/US2006/023362 issued May 12, 2009.
The International Search Report and Written Opinion for PCT/US2008/064136 mailed on Sep. 26, 2008.
Office Action issued in Chinese Patent Application No. 2006800293133 dated Jul. 3, 2009.
International Preliminary Report on Patentability for PCT/US2007/089061 mailed Jul. 9, 2009.
Kwiatkowski, K. et al.; "Development of 3-D Packaging for High-Bandwidth Massively Paralleled Imager" presentation found online at http://www.iworid2002.nl/pdf/kwiatkowski.pdf; 2002.
International Preliminary Report on Patentability for PCT/US2008/064136 mailed Oct. 1, 2009.
International Preliminary Report on Patentability for PCT/IB2008/001429 mailed Oct. 15, 2009.

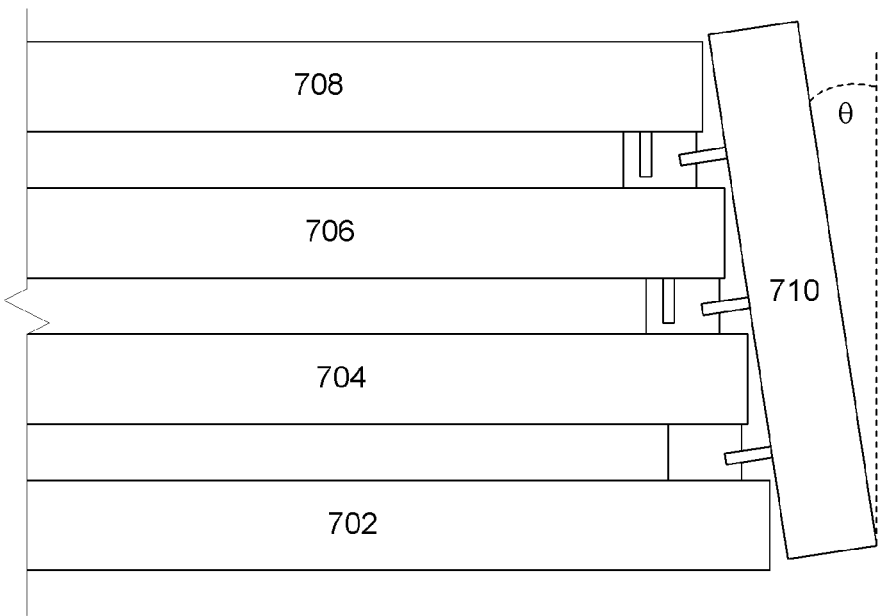
FIG. 10
FIG. 11
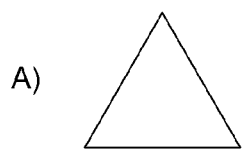  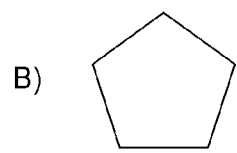  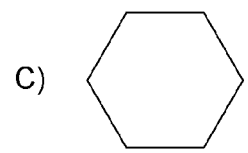
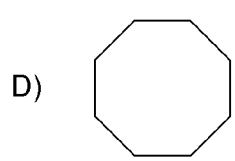  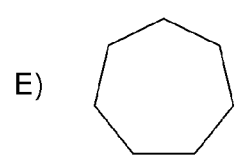
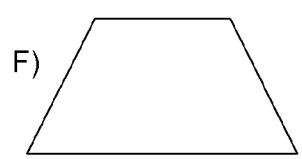  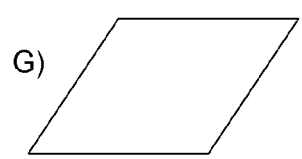  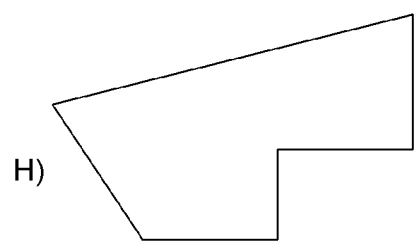

SIDE STACKING APPARATUS AND METHOD

CROSS REFERENCE TO RELATED APPLICATIONS

This application is a continuation-in-part of, and claims priority from, U.S. patent applications, Ser. Nos. 11/329,481, 11/329,506, 11/329,539, 11/329,540, 11/329,556, 11/329,557, 11/329,558 now U.S. Pat. No. 7,560,813, Ser. No. 11/329,574 now U.S. Pat. No. 7,534,722, Ser. Nos. 11/329,575, 11/329,576, 11/329,873 now U.S. Pat. No. 7,538,033, Ser. Nos. 11/329,874, 11/329,875, 11/329,883, 11/329,885, 11/329,886 now U.S. Pat. No. 7,521,806, Ser. No. 11/329,887 now U.S. Pat. No. 7,215,032, Ser. Nos. 11/329,952, 11/329,953 now U.S. Pat. No. 7,157,372, Ser Nos. 11/329,955, 11/330,011 all filed on Jan. 10, 2006 and Ser. No. 11/422,551 file Jun. 6, 2006, which each claim priority under 35 U.S.C. §119(e)(1) from U.S. Provisional Patent Application Ser. No. 60/690,759, filed Jun. 14, 2005 all of which are incorporated herein by reference.

BACKGROUND

Field of the Invention

The present invention relates to semiconductors and, more particularly, to stacking of device-bearing semiconductors.

For some time now, there has been a desire to increase the number of devices that can occupy a particular area on a circuit board in order to reduce the overall circuit board size. One of the ways that entities have approached doing so is by stacking packaged chips on top of one another. This is typically accomplished by use of an ancillary element, for example, a mini "circuit board" or "interposer" that two or more chips can connect to, or through use of flexible circuitry on a ribbon-like material that can wrap over or around one or more chips to effect the same result. These approaches connect to the chips from the top surfaces (i.e. at the points of connection) so the connecting material or interposer is parallel to the chips themselves. These two approaches achieve a smaller footprint, but do so at the expense of, for example added parasitic capacitance, noise or both. Moreover, such elements are always passive elements in that they cannot themselves include integrated circuit devices.

Thus, there is a need in the art for a better way of stacked packaging that does not require the use of such ancillary elements, is not restricted by the geometries and limited connectivity of the above approaches, or both.

SUMMARY OF THE INVENTION

We have devised a way of creating denser packages of stacked integrated circuits ("ICs") (whether chips or dies) (hereafter "ICs") that avoids the requirement of using purely passive ancillary elements like mini circuit boards, interposers or flexible circuits.

Advantageously, although the approaches herein avoid the above requirement, they are fully compatible with the techniques described above and thus provide benefits and advantages over and above such techniques, even where an ancillary element approach is used.

One aspect involves a module that has at least two ICs electrically and physically connected to each other such that they lie in different planes and are arranged as a first stack of ICs, a third IC electrically and physically connected to at least one of the at least two ICs, wherein the third IC is off plane from both of the at least two ICs, and at least one electrical connection exists between the third IC and the at least one of the at least two ICs. This electrical connection can be a post an penetration connection or some other form of connection.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

FIGS. 7 through 10 illustrate, in overly simplified form, a variant of the approach of FIGS. 1 through 4;

FIG. 11A through 11H illustrate, in simplified form, various IC shapes suitable for use with the approach described herein;

DETAILED DESCRIPTION

U.S. patent applications, Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, incorporated herein by reference, describe various techniques for forming small, deep vias in, and electrical contacts for, semiconductor wafers. Our techniques allow for via densities and placement that was previously unachievable and can be performed on a chip, die or wafer scale. Moreover, our techniques allow for more flexible approaches stacking of chips to reduce the footprint occupied by chips relative to a simply coplanar arrangement of the same chips.

Specifically, our approach can leverage a solder connection or a post and penetration type connection as well as the various attachment approaches in the above-incorporated applications, like a well or reverse well approach, to facilitate attaching of one element to another element, irrespective of whether each is a chip, die, or passive element such as a re-direction layered ("RDL") element or even an interposer or flexible circuitry on a ribbon-like material.

Moreover, our approach removes an orientation limit present in the conventional approach of vertically stacking chips in parallel planes. With our approach, the stacking can occur in substantially perpendicular as well as parallel planes.

The approach is described by way of a few examples wherein those examples generically illustrate a much broader scope due to the limitless number of variations that can be created.

Figure 1:
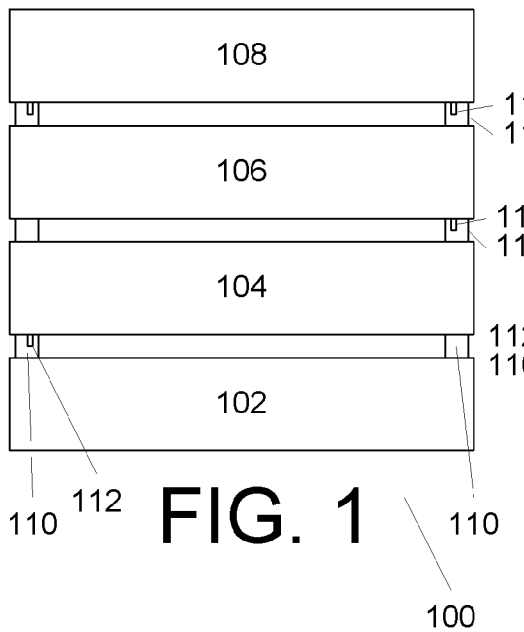
FIGS. 1 through 4 illustrate, in overly simplified form, a first generic example of the approach.

FIGS. 1 through 4 illustrate a first generic example of the approach. With this example, a module 100 made up of multiple ICs have been configured to be stacked on each other, for example, in the manner of the aforementioned applications or some other manner. For purposes of illustration, FIG. 1 shows, in overly simplified form, a cross section of four ICs 102, 104, 106, 108 that are both physically and optionally electrically connected to each other in a stack. This can be done using a post and penetration approach, a solder process, an epoxy, spin on glass, photoresist or other adhesive material whether conductive or not. Alternatively, the ICs can be temporarily held in a stacked arrangement (for example, by tooling or even via gravity) with a subsequent process being used to permanently maintain the stacked arrangement through mechanical and/or electrical connection to one or more elements that are connected off plane to the stack. For purposes of illustration most of the IC-to-IC connections are not shown, but should be presumed to exist as required. Such connections could be between the ICs as well as, optionally, on the bottom of the lowest IC 102 and/or the top of the uppermost IC 108. In addition to those connections, some of the ICs include connection points 110, and are shown, that are located near the periphery of the ICs. Depending upon the specific IC, the connection points 110 can be located directly at, for example, a contact pad, or can be located on a connection trace that extends between two or more locations or simply reroutes a connection point to the periphery of the IC. For purposes of illustration, each of these connection points 110 is configured as a malleable contact of a post and penetration connection as described in each of incorporated U.S. patent applications, Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, and may also be used to also establish a post and penetration connection with a post 112 of another IC in the stack, such as shown in FIG. 1.

Figure 2:
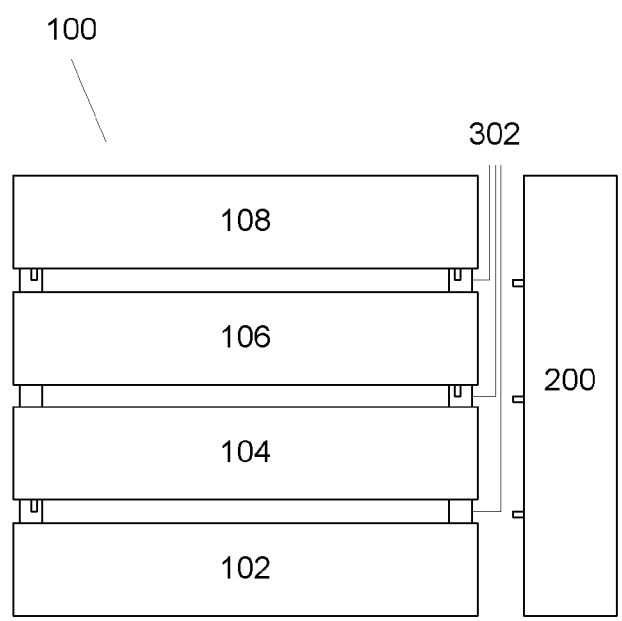

FIG. 2 illustrates, in overly simplified form, a side view of a further IC 200 that is configured to interconnect with the IC stack 100 of FIG. 1. As shown, this IC 200 includes a series of outwardly-extending posts 112 that are configured as rigid contacts and positioned to both align and mate with their respective malleable contacts at the connection points 110. As with the malleable contacts, numerous rigid posts are described in detail in the above-incorporated U.S. patent applications.

Figure 3:
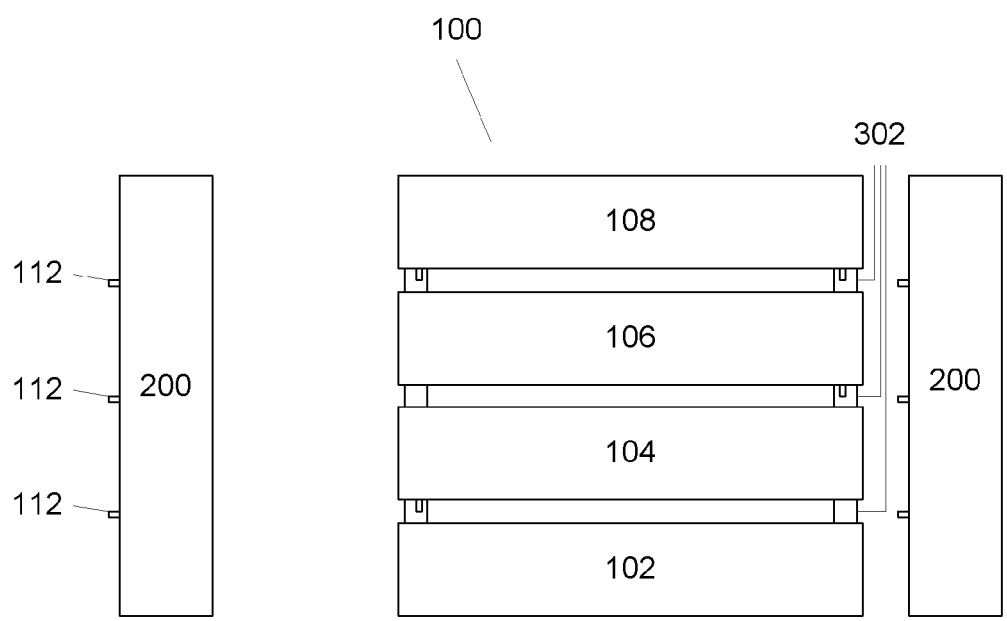

FIG. 3 illustrates, in overly simplified form, the stack of ICs 100 of FIG. 1 and the IC 200 of FIG. 2 immediately before joining them together to form a module. As can be seen, the IC 200 is now substantially perpendicular to the stack of ICs 100 and the posts 112 are aligned with their malleable counterparts 302. Note that, advantageously, if a post and penetration-type connection is used, the ICs in the stack 100 and the IC 200 need not be absolutely perpendicular. In fact, the ICs in the stack 100 also need not be in perfect alignment with each other. Instead, the connections can tolerate as much offset as the contact size and post length allows. Thus, as used herein the terms perpendicular and substantially perpendicular should be understood to be identical in meaning and used interchangeably with each other, with the meaning being simply as close to perpendicular as is necessary to effect the desired connections which, as will be understood from one of the examples below, can actually be a substantial deviation from a mathematical definition of perpendicular (i.e. 90°). For convenience, the term "off plane" will sometimes be used herein to generically refer to an IC that is substantially perpendicular to another IC. In addition, the use of a tight-geometry post and penetration, covalent bonding, metal-to-metal fusion or other close-fit connection processes allow the individual ICs 102, 104, 106, 108 to be stacked much closer together and the individual ICs to be thinned very small so that the structure or structural support can be provided by one or more off plane pieces, for example, the IC 200 and the overall height of the stack can be far shorter than if an interposer were used. In fact, through use of the approach described herein two ICs in a stack can be spaced apart from each other by 100 μm or less and an off plane IC can be connected to it and, itself, be spaced from one or both of the ICs by 100 μm or less. For example, with highly thinned ICs and post and penetration connections on the off plane IC on pitches of 25 μm, the height of a stack of four chips could be slightly more than 100 μm. ICs could even be thinned so that an off plane IC with post and penetration connections on a 5 μm pitch would result in a stack that is slightly more than 20 μm high. In contrast, with a traditional interposer, if such interposers were substituted for two of the ICs 104, 108, each of the interposers would likely be 100 μm thick. Thus, the resultant stack involving the interposers would be many times thicker and include half the number of ICs of the stack 100.

Figure 4:
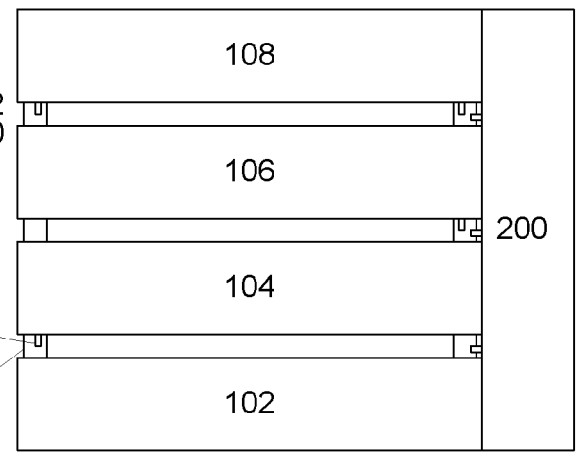

The contacts 112 on the IC are then brought into contact forming the connection between the IC 200 and the stack 100. If post and penetration connections are used, then the connections 112 would be posts which connect, under the appropriate pressure, with the corresponding malleable contacts 302 thereby forming the post and penetration connection between the IC 200 and the stack 100, as shown in FIG. 4.

Depending upon the particular implementation, the off plane element can, itself, be an integrated circuit bearing chip (or a portion thereof) or can be a passive element (whether rigid or flexible) or some other element, for example, a packaging element that contains RDLs but no circuitry. Thus, in the examples that follow, although the off plane pieces are described as ICs, it should be understood that the term "ICs" herein are not restricted to integrated circuits but could instead be (and are intended to encompass) any of the above passive elements as well.

At this point it should be appreciated that, with some implementations, the post and penetration connection can optionally be augmented by use of our tack and fuse process, which is described in detail in the above-incorporated U.S. patent applications. With this approach, a tack connection can be used to initially join the chips in a non-permanent connection. At some point thereafter, the chips can undergo a fuse process to make the connections "permanent." In an alternative optional approach, a fuse process can be used without the tack process, although this will directly make the connections permanent.

Furthermore, with this off plane stacking approach, in some implementation situations, a reflowable material like a solder could be substituted for the malleable material if a barrier is used to confine the molten solder and prevent it from causing an undesirable short with another connection. Depending upon the implementation, this "barrier" approach can involve use of a well, such as described in the above-incorporated applications, or some other physical wall that is part of, applied to or formed on the IC. Alternatively, for example, if the connection components 110, 112 were a pure metal like copper or pure oxide, a metal-to-metal, in this example, copper-to-copper fusion or covalent bonding process, respectively, could be used to similar effect—the former being used if an electrically conductive bond is required. However, since these processes do not have any penetration, they are less amenable to off plane connections where exact connection surfaces of the pieces to be joined deviate from parallel.

Based upon the foregoing, it should now be understood that this approach can occur on more than one side of a chip stack. Thus, it is possible to connect two or more perpendicular chips to a stack, thereby allowing for mixing of different speed technology chips and shortening connections between chips.

Figure 5:
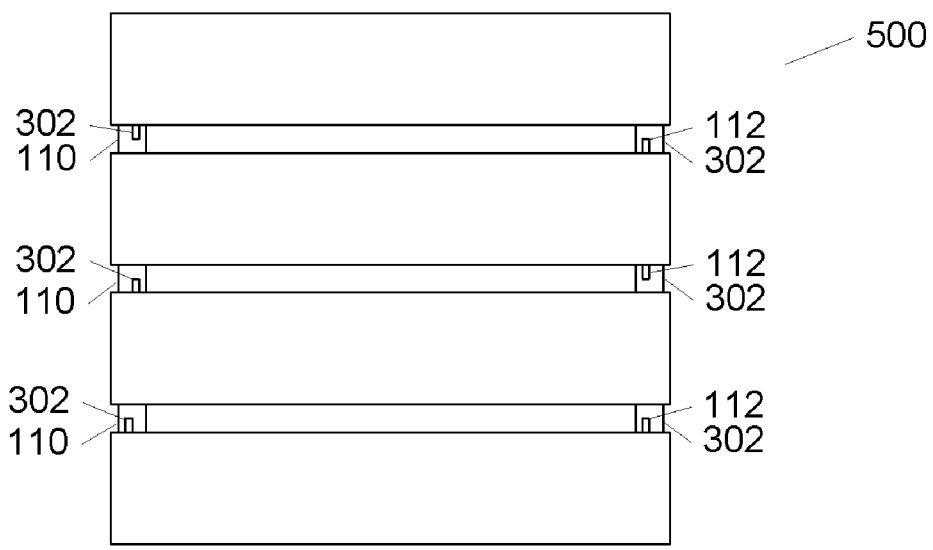
FIG. 5 illustrates, in overly simplified form, one example of a module where the chips include a mixture of rigid posts and malleable contacts.

Depending upon the particular implementation, it should be understood that the formation of the stack of ICs can occur before, or concurrent with, the attachment of the perpendicular IC. Moreover, it should be understood that, while the above example located all of the malleable contacts in the stack of ICs and the rigid posts on the perpendicular IC for purposes of illustration and simplicity, different implementations can place the malleable or other type of contacts 302 on a perpendicular IC and the posts 112 on the mating ICs. Of course, still other implementations can have any one or more of the ICs each include a mixture of different contact types such as, for example, rigid posts 112 and malleable contacts 302 such as shown in the stack 500 of FIG. 5.

Figure 6:
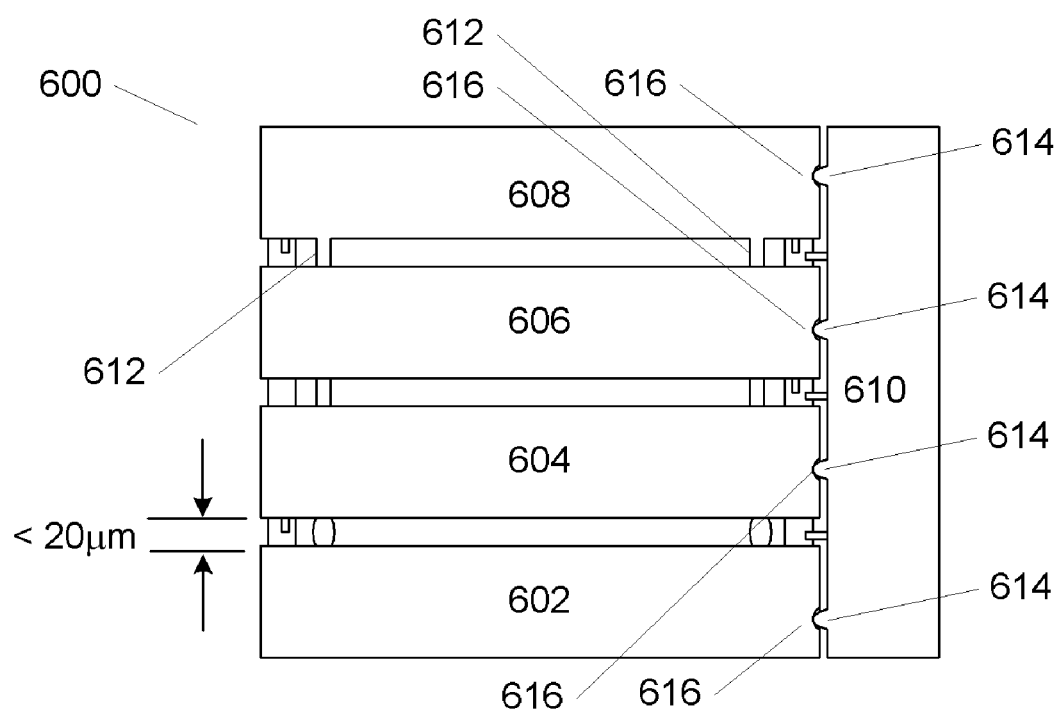
FIG. 6 illustrates, in overly simplified form, how one or more of the ICs can include additional features to augment the approach.

Bearing the above in mind, additional aspects can advantageously be incorporated into the approach. For example, as shown in FIG. 6, one or more of the ICs 602, 604, 606, 608, 610 in a module 600 can include a feature 612 that, depending upon the particular instance, can be formed on the IC or formed separately and attached to the IC. The particular feature can be formed through use of a known etching technique on the IC or formed separately from some other appropriate material, be it a plastic, ceramic, semiconductor, deposited metal or other material. The feature can thus serve as a spacer to maintain or define a minimum separation between the IC and some other IC, act as an alignment element 614 itself or in a mating fashion with another feature 616, or serve some other purpose for the particular application.

Alternatively and/or optionally, a "standoff" can be created directly under a malleable or solder contact to create a minimum and reproducible spacing between adjacent pieces in a stack or between an off plane IC and a stack.

FIGS. 7 through 10 illustrate, in overly simplified form, a variant of the approach of FIGS. 1 through 4 in order to illustrate why "perpendicular," as that term is used herein includes a substantial deviation from the mathematical definition of perpendicular bearing in mind that the figures contained herein are not to scale and, in fact, the scale is grossly distorted. Nevertheless, this distortion helps to more clearly illustrate the concept.

Figures 7, 8:
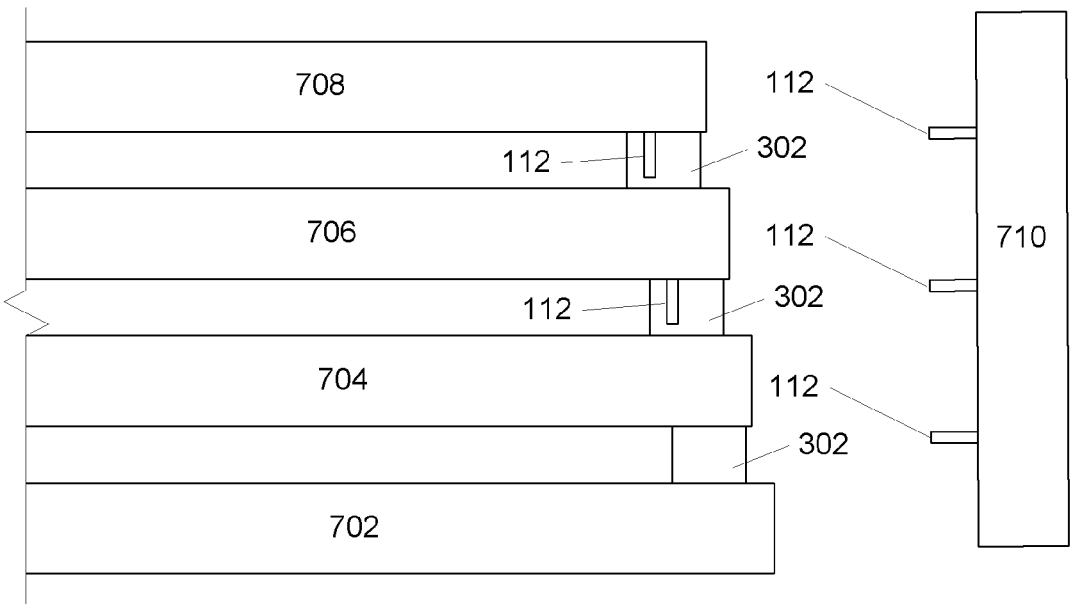
Figure 9:
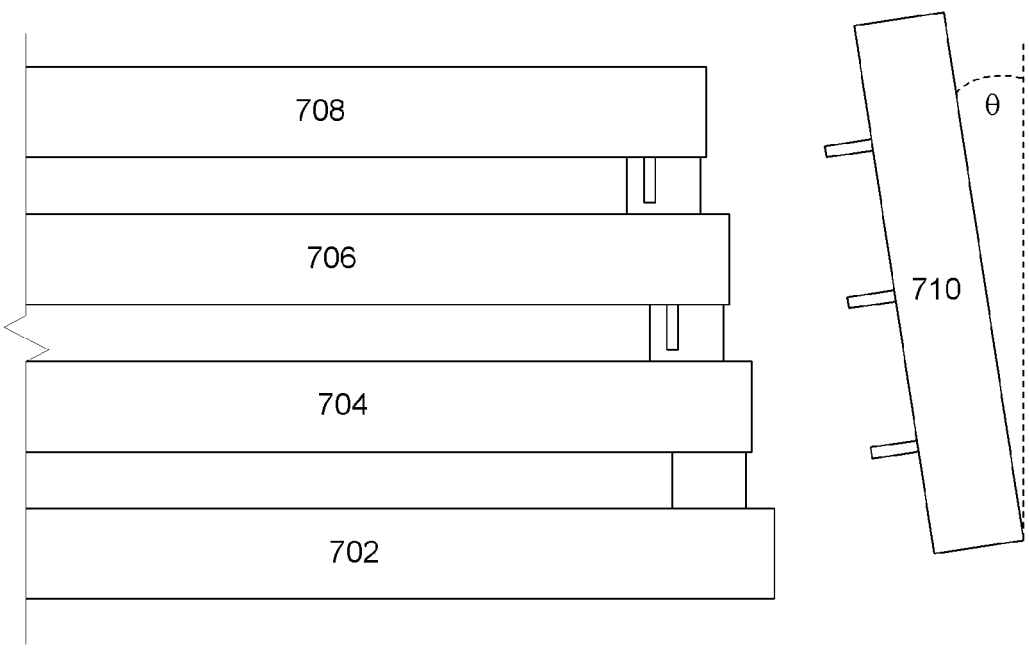

FIG. 7 illustrates, in overly simplified form, a portion 700 of a stack of ICs 702 having malleable contacts 302 at the periphery in which there is substantial misalignment moving from IC to IC in the stack. However, in this example implementation, the misalignment of the ICs is within the length tolerance of the length of the rigid posts 112 on another IC 710 that that will be joined to the stack 700. As a result, despite the misalignment, an off plane IC such as shown in FIG. 8, can still be attached to the stack of ICs via its posts. FIG. 9 illustrates, in overly simplified form, the intended off plane IC 710 of FIG. 8 and the stack 700 of FIG. 7 immediately before joining them together. FIG. 10 illustrates, in overly simplified form, the module 1000 created after the off plane IC 710 has been brought into alignment and the posts 112 of the off plane IC have penetrated their respective malleable contacts 302 on the IC stack 700 forming an electrical connection among the off plane IC 710 and the IC stack 700. Note here that, in order for this approach to work, if the deviation among the ICs in the stack is not substantial (i.e. within the tolerance of the posts when configured for an aligned stack of ICs), the post can be configured in the manner they would if it was to be joined to an aligned stack. However, if the stack deviates (intentionally or unintentionally) by more than such an amount, the spacing between post may have to be adjusted prior to formation or through rerouting to account for the deviation.

At this point it should be mentioned that, although the above examples have used a single off plane IC, the off plane IC could equally be part of an IC stack itself. As a result, it should be appreciated that chip modules can be formed in geometries that go far beyond simple vertical stacking. Moreover, because the above approach provides a way to bring connections closer together by allowing them to reside on different ICs than they otherwise would in a simple coplanar or vertically stacked arrangement, connections can be shortened, different speed ICs can be mixed, and problems like noise and parasitics can be addressed in entirely new ways. Still further, through use of the approach, ICs having shapes (in plan view) other than square or rectangular, such as those representative examples shown in FIG. 11A through 11H, for example, ICs of triangular, other quadrilateral, hexagonal, octagonal, or even irregular shapes can be used, the limiting factor now being the ability to dice those shapes from a wafer or otherwise saw, cut or create them.

Figure 12:
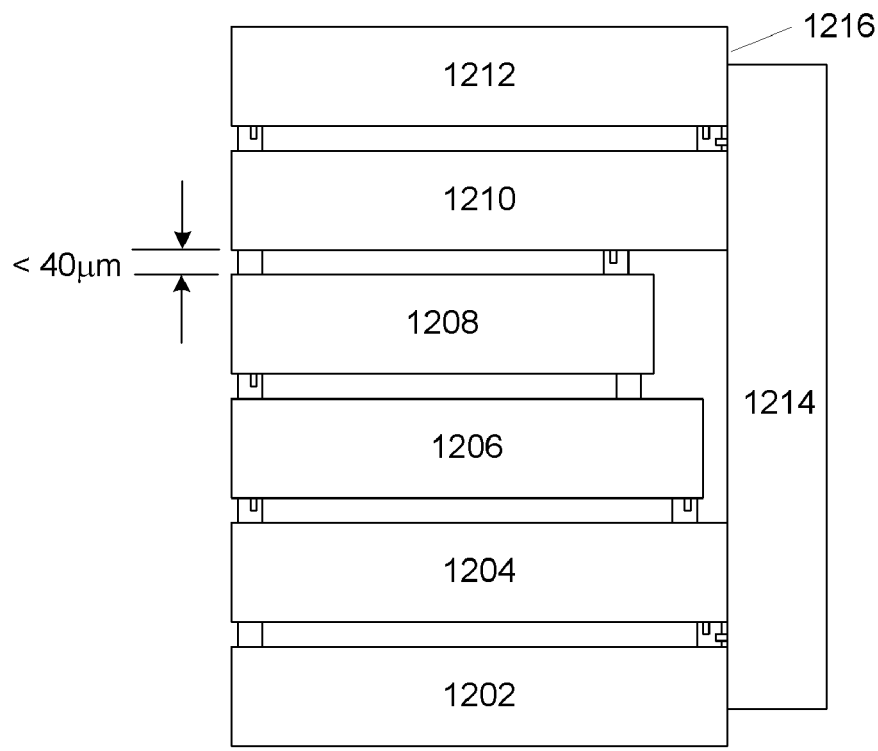
FIG. 12 illustrates, in overly simplified form, a module where the ICs that are bridged to each other have a commonly aligned edge.
Figure 13:
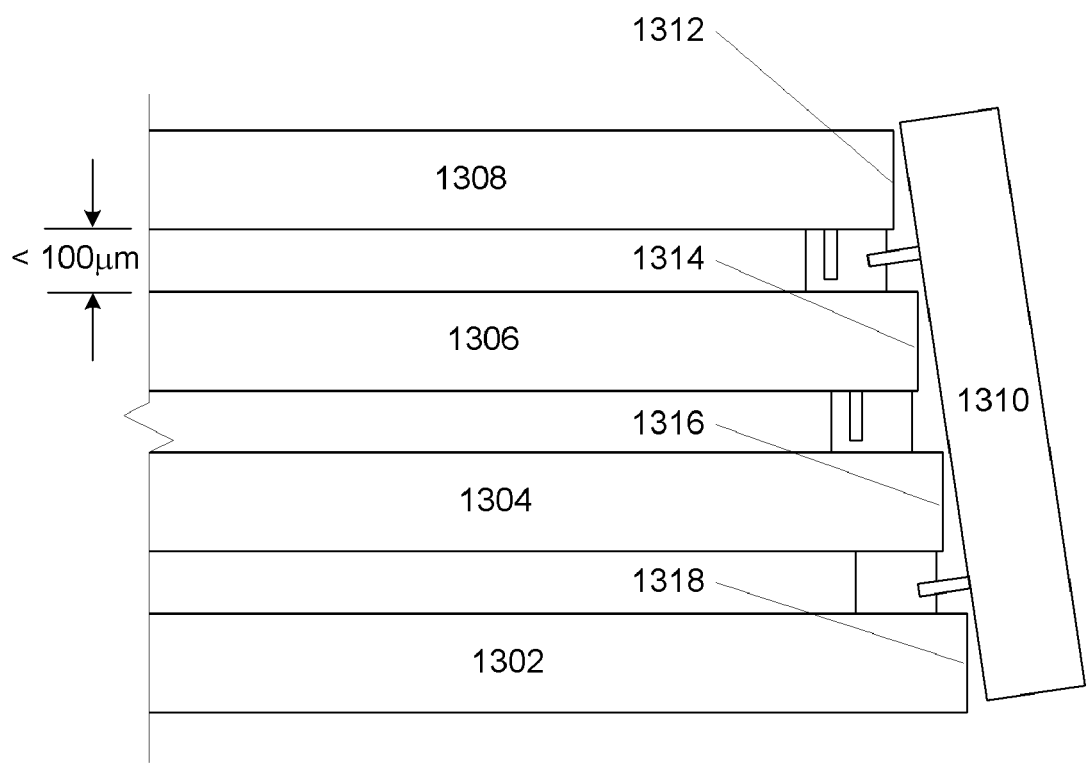
FIG. 13 illustrates, in overly simplified form, a module where the ICs that are bridged to each other are offset from each other.

Still further, it is to be understood that the off plane IC can be used to bridge ICs so as to provide a more direct connection between them while bypassing one or more ICs that are located in between them. This approach is illustrated, in overly simplified form, in FIG. 12 where the ICs that are bridged to each other 1202, 1204, 1210, 1212 have a commonly aligned edge 1216 and in FIG. 13 where the ICs 1302, 1306, 1308 that are bridged to each other are offset from each other (i.e. their pertinent edges 1312, 1314, 1316, 1318 are not commonly aligned).

FIGS. 14 through 17 illustrate, in overly simplified form, some example modules 1400, 1500, 1600, 1700 employing our approach and the kinds of complex configurations ICs made possible through use of our approach (with the understanding that these examples are purely representative and could never illustrate every possible permutation and combination). As shown in FIGS. 14 through 17, the connections between ICs include one or more of a post and penetration connection, a confined solder connection, a metal-to-metal fusion connection and/or a covalent bonding connection.

Figure 14:
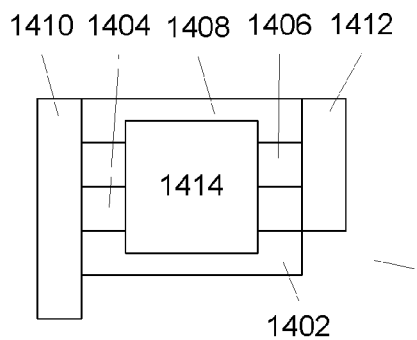
FIGS. 14 through 17 illustrate, in overly simplified form, some example modules employing the approach described herein.

For example, as shown in the module 1400 FIG. 14, a stack of four ICs 1402, 1404, 1406, 1408 are have an off plane IC 1410 connected to them on the left side and three of the ICs 1404, 1406, 1408 in the stack also have an off plane IC 1412 on their right side. In addition, a further IC 1414 bridges the ICs 1402, 1404, 1406, 1408 in the stack on the front side.

Figure 15:
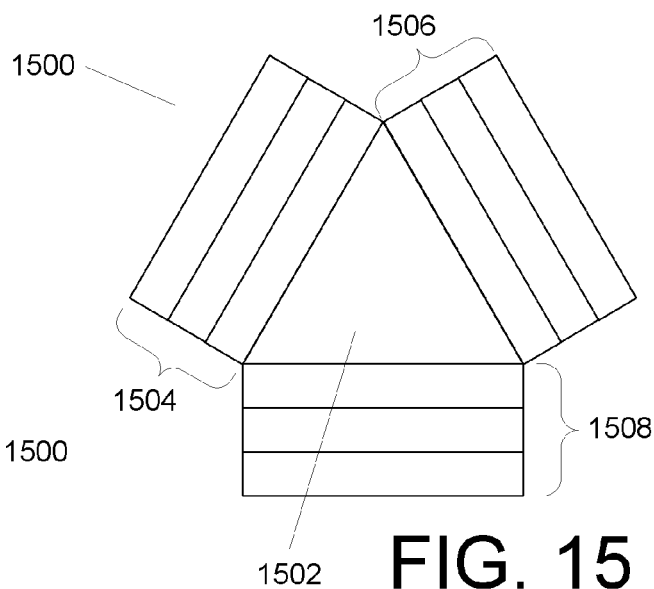

As shown in the module 1500 of FIG. 15, a stack of multiple triangular ICs 1502 (only one of which is visible in this view) each has a stack of three ICs 1504, 1506, 1508 on each of the three side faces of the stack 1502.

Figure 16:
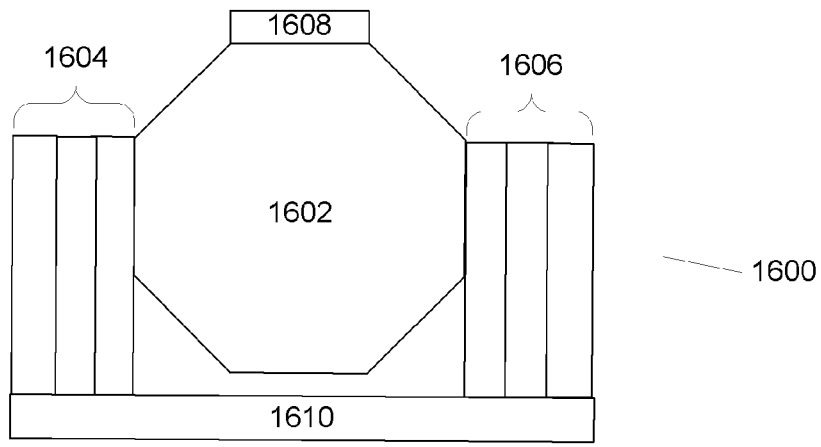

As shown in FIG. 16, a more complex module 1600 arrangement has a stack of multiple octagonal ICs 1602 (only one of which is visible in this view) having a stack of three ICs 1604, 1606 on either side, a single IC 1608 on the upper face and a single IC 1610 on the lower face that also bridges the stacks on either side to each other.

Figure 17:
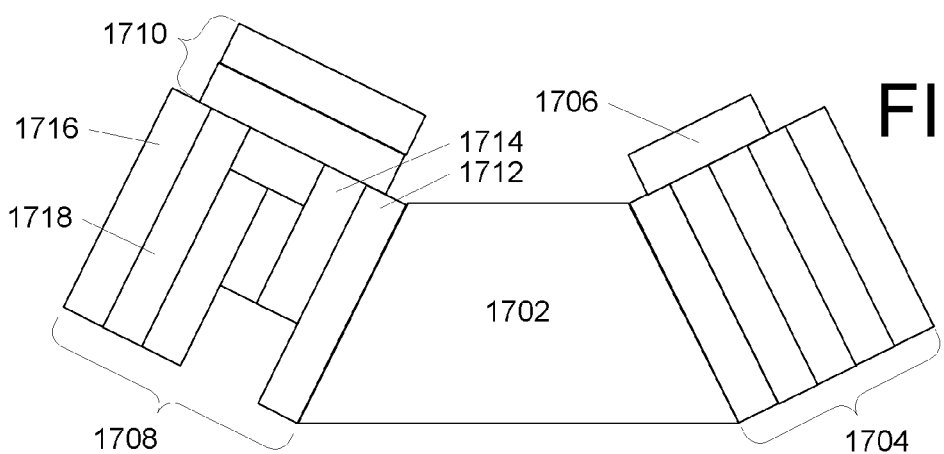

As shown in the module 1700 of FIG. 17, a stack of multiple trapezoidal ICs 1702 (only one of which is visible in this view) have an off plane stack of ICs 1704 connected to it on the right side and that stack 1704, in turn, has an off plane IC 1706 on its upper surface. In addition, the trapezoidal stack 1702 has a stack 1708 of varying size ICs on its left side which, in turn has a two IC stack 1710 bridging the lower two ICs 1712, 1714 to the upper two ICs 1716, 1718.

From the modules of FIGS. 14 through 17, it can be seen that any IC can be an off plane IC with respect to a particular stack while also being part of a stack itself and even having an off plane IC connected to it or another one or more ICs in its stack.

Figure 18:
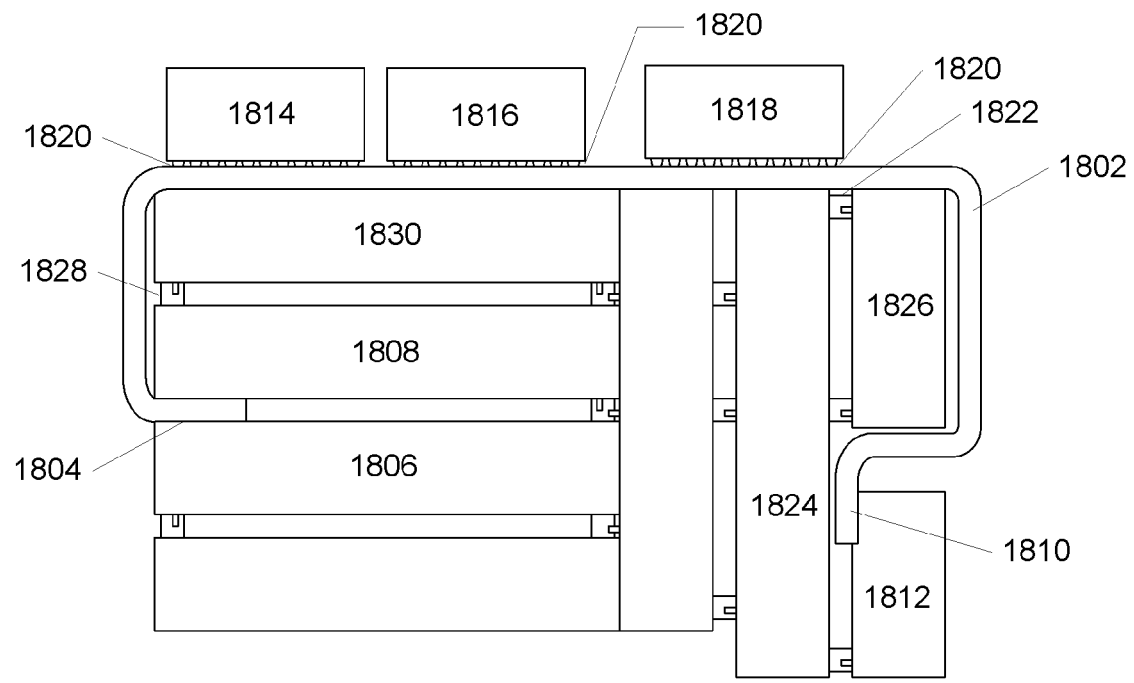
FIG. 18 and FIG. 19 illustrate, in overly simplified form, how the approach described herein can be used with conventional passive elements.
Figure 19:
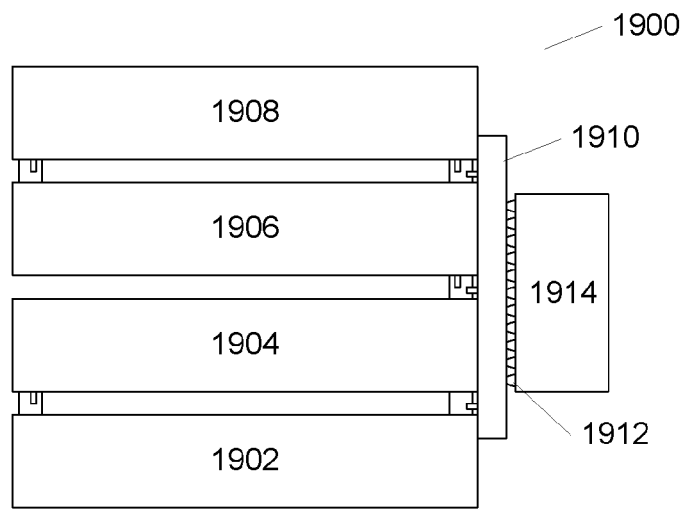

FIG. 18 and FIG. 19 illustrate, in overly simplified form, how the approach described herein can be used with conventional passive elements such as an element configured with an RDL as well as interposers or flex circuitry.

As shown in FIG. 18, a module 1800 is made up of complex stack of ICs and also includes a passive element 1802, in this case flex circuitry, that interconnects a connection point 1804 between the middle two ICs 1806, 1808 in the vertical stack with a connection point 1810 of the lower IC 1812 at the rightmost extreme of the module and partially wraps around a portion of the module. In addition, the passive element is configured so that conventional ICs 1814, 1816, 1818 can be connected to it using conventional techniques, such as, for example, the ball grid arrays 1820 on the three chips located above the top of the passive element 1802.

As shown in FIG. 19, a module 1900 is made up of a stack of four vertically stacked ICs 1902, 1904, 1906, 1908. In addition, the module 1900 includes a passive element 1910, in this case an interposer that has rigid posts on one face so that it can form post and penetration interconnections with the stacked ICs 1902, 1904, 1906, 1908 and conventional connections 1912 on its other face where a conventional IC 1914 is connected in a known manner.

Finally, in some implementations, the passive elements 1802, 1910 of FIG. 18 or of FIG. 19 can optionally include, in the case of the passive element 1802 of FIG. 18 a rigid portion, or, in the case of the passive element 1910 of FIG. 19, a flexible portion so that it can be supportive (in the case of the passive element 1802 of FIG. 18) or wrap around more than one side (in the case of the passive element 1910 of FIG. 19) and, optionally, form connections on faces of ICs in addition to on the side of a stack. In such an implementation, the passive element, for example the passive element 1802 of FIG. 18 could include a connection that joins to the stack, by way of example, at the connection point 1822 between the two upper and rightmost chips 1824, 1826 or at another connection point between the two upper leftmost chips 1808, 1830.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A module, comprising:
   at least two integrated circuits (ICs) connected to each other by a physical connection and arranged as a first stack of ICs, wherein the at least two ICs comprise a first IC and a second IC, and wherein the at least two ICs lie in different planes and are spaced apart from each other by a spacing of less than 100 µm; and
   a third IC connected to at least one of the at least two ICs at a point physically located between facing surfaces of the at least two ICs, wherein the third IC is spaced apart from the at least two ICs at a distance of no more than 100 µm and is off plane from both of the at least two ICs, and wherein the third IC is electrically connected to at least one of the at least two ICs at the point.

2. The module of claim 1, wherein the physical connection further comprises an electrical connection between the at least two ICs.

3. The module of claim 2, wherein the physical connection is formed by a rigid post that penetrates into a malleable material.

4. The module of claim 2, wherein the physical connection comprises any one or more of: a) at least one confined solder connection; b) at least one fusion connection; c) a well-type connection; or d) at least one covalent bond connection.

5. The module of claim 1, wherein the third IC comprises at least one of an integrated circuit or a passive element, and wherein the third IC substantially faces at least one side surface of one of the first or second ICs.

6. The module of claim 1, wherein the third IC comprises a plurality of outwardly-extending rigid posts that penetrate into a malleable material at the point physically located between facing surfaces of the at least two ICs.

7. The module of claim 1, wherein the at least two ICs each have a commonly aligned edge with each other, and wherein the third IC is substantially perpendicular to and connects to the at least two ICs at the commonly aligned edge.

8. The module of claim 7, wherein the third IC is one IC in a second stack of additional ICs.

9. The module of claim 7, further comprising a fourth IC that is off plane relative to at least one of the at least two ICs.

10. The module of claim 9, wherein the fourth IC is off plane relative to the third IC.

11. The module of claim 7, wherein an IC from among the at least two ICs and the third IC has a polygonal shape in a plan view, wherein the polygonal shape is other than a square shape or a rectangular shape.

12. The module of claim 7, wherein the third IC bridges between at least one of the at least two ICs and an additional IC that is separated from the at least one of the at least two ICs by at least one intervening IC, and wherein the third IC is electrically connected to the additional IC by at least one post-and-penetration connection.

13. The module of claim 7, further comprising at least one feature on a specified IC of the one or more of the at least two ICs or the third IC, wherein the at least one feature is located and sized to act as a spacer and to establish a minimum allowable spacing between the specified IC and at least another IC.

14. The module of claim 7, further comprising at least one contact on a specified IC of the one or more of the at least two ICs or the third IC, wherein the contact is sized to act as a spacer and to establish a minimum allowable spacing between the specified IC and at least another IC.

15. The module of claim 13, wherein the at least one feature is part of the specified IC.

16. The module of claim 13, wherein the at least one feature is attached to the specified IC.

17. The module of claim 13, wherein the at least one feature comprises a bonding agent.

18. The module of claim 17, wherein the bonding agent comprises a cured resin.

19. The module of claim 1, wherein the at least two ICs each have a common edge with each other, wherein the common edges are offset from each other, and wherein the third IC is substantially perpendicular to and connects to the at least two ICs at the common edge.

20. The module of claim 19, wherein the third IC is one IC in a second stack of ICs.

21. The module of claim 19, further comprising a fourth IC that is off plane relative to at least one of the at least two ICs.

22. The module of claim 21, wherein the fourth IC is off plane relative to the third IC.

23. The module of claim 19, wherein an IC from among the at least two ICs and the third IC has a polygonal shape in a plan view, wherein the polygonal shape is other than a square shape or a rectangular shape.

24. The module of claim 19, wherein the third IC bridges between at least one of the at least two ICs and an additional IC that is separated from the at least one of the at least two ICs by at least one intervening IC, and wherein the third IC is electrically connected to the additional IC by at least one post-and-penetration connection.

25. The module of claim 1, wherein the third IC is a passive element electrically connecting a specific IC of the module to another specific IC of the module, and wherein the passive element is connected to at least one of the specific IC of the module or the other specific IC of the module by at least one post-and-penetration connection.

26. The module of claim 25, wherein the passive element comprises a rigid portion.

27. The module of claim 25, wherein the passive element comprises a flexible portion.

28. The module of claim 27, wherein the passive element further comprises a rigid portion.

29. The module of claim 27, wherein the passive element wraps around at least two sides of a stack.

30. A system, comprising:
a stack of a plurality of integrated circuits (ICs) including at least two ICs connected to each other by a physical connection and arranged as a first stack of ICs, wherein the at least two ICs comprise a first IC and a second IC, and wherein the at least two ICs lie in different planes and are spaced apart from each other by a spacing of less than 100 µm; and
a third IC connected to at least one of the at least two ICs at a point physically located between facing surfaces of the at least two ICs, wherein the third IC is spaced apart from the at least two ICs at a distance of no more than 100 µm and is off plane from both of the at least two ICs, and wherein the third IC is electrically connected to at least one of the at least two ICs at the point.

31. The system of claim 30, wherein the third IC is substantially perpendicular to the first and second ICs.

32. The system of claim 31, wherein the first and second ICs have a commonly-aligned edge, and wherein the third IC is substantially perpendicular to and is coupled to the first and second ICs at the commonly-aligned edge.

* * * * *